United States Patent
Choi

(10) Patent No.: US 7,247,917 B2
(45) Date of Patent: Jul. 24, 2007

(54) NONVOLATILE SEMICONDUCTOR MEMORY DEVICES AND METHODS OF MANUFACTURING THE SAME

(75) Inventor: Tae Ho Choi, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/023,314

(22) Filed: Dec. 27, 2004

(65) Prior Publication Data

US 2005/0139896 A1  Jun. 30, 2005

(30) Foreign Application Priority Data

Dec. 26, 2003  (KR) ............... 10-2003-0097919

(51) Int. Cl.
*H01L 29/78* (2006.01)
(52) U.S. Cl. ............... 257/401; 257/365; 257/E21.64; 438/201; 438/265
(58) Field of Classification Search ............... 257/401, 257/E21.64; 438/201, 265
See application file for complete search history.

(56) References Cited

U.S. PATENT DOCUMENTS 5,751,039 A  *  5/1998  Kauffman et al. .......... 257/316
5,994,733 A  *  11/1999  Nishioka et al. ............ 257/316
6,137,133 A  *  10/2000  Kauffman et al. .......... 257/316
6,271,087 B1 *  8/2001  Kinoshita et al. ........... 438/258
6,441,428 B1 *  8/2002  Ghodsi ....................... 257/315
2002/0130351 A1* 9/2002  Ghodsi ....................... 257/315
2002/0153546 A1* 10/2002 Verhaar ...................... 257/296
2004/0079984 A1* 4/2004  Kao et al. ................... 257/315

* cited by examiner

*Primary Examiner*—Andy Huynh
*Assistant Examiner*—Earl Taylor
(74) *Attorney, Agent, or Firm*—Andrew D. Fortney

(57) ABSTRACT

Nonvolatile semiconductor memory devices and methods of manufacturing the same are disclosed. A disclosed nonvolatile semiconductor memory cell includes a semiconductor substrate; first and second semiconductor cells positioned on the semiconductor substrate at a distance from each other; a first source and a second source adjacent the first and second semiconductor cells; a first drain contact between the first and second semiconductor cells; first and second cap dielectrics formed on the first and second semiconductor cells, respectively; first and second sidewall spacers formed on sidewalls of the first and second semiconductor cells, respectively; an inter metal dielectric layer covering the first and second cap dielectrics and the first and second sidewall spacers, a drain contact hole exposing the drain; and a second drain contact connected to the first drain contact through the drain contact hole.

20 Claims, 3 Drawing Sheets

NONVOLATILE SEMICONDUCTOR MEMORY DEVICES AND METHODS OF MANUFACTURING THE SAME

FIELD OF THE DISCLOSURE

The present disclosure relates generally to nonvolatile semiconductor memory devices and methods of manufacturing the same, and, more specifically, to flash memory devices and methods of manufacturing flash memory devices.

BACKGROUND

Typically, semiconductor memory devices are classified into one of two categories, namely, volatile memories and nonvolatile memories. Volatile memory devices such as dynamic random access memory (DRAM) and static random access memory (SRAM:) are capable of retaining information only when supplied with power. In contrast, nonvolatile memory devices such as the read only memory (ROM) retain the data they store even when they are not supplied with power.

Currently, nonvolatile memory devices are classified as either a floating gate type or a metal insulator semiconductor (MIS) type. MIS type devices are formed so as to be double or triply layered by two kinds of dielectric layers.

The floating gate type of memory device is implemented with storage characteristic using potential wells. Flash electrically erasable programmable read only memory (EEPROM) is an example of the floating gate type of memory device. Flash EEPROM has an EPROM Tunnel Oxide (ETOX) cell structure and split gate type structure.

However, the ETOX cell has a drawback. In particular, the available cell size increases even though its simple layered structure is implanted in a small size since the drain contact should be formed along a bit line. That is, since the drain contact should be formed for each cell, a large area is required to secure the contact area and an overlap area between the contact and active region per cell.

The split gate cell has 2 transistors per cell, (i.e., a select transistor without a floating gate and a storage transistor with the floating gate that are serially connected with each other). However, the split gate cell also has drawbacks. In particular, the cell size increases by adding the select transistor to each cell, and the cell size further increases to secure the margin for self-aligning the channels of the select transistor and the storage transistor with the respective gates.

Figure 1:
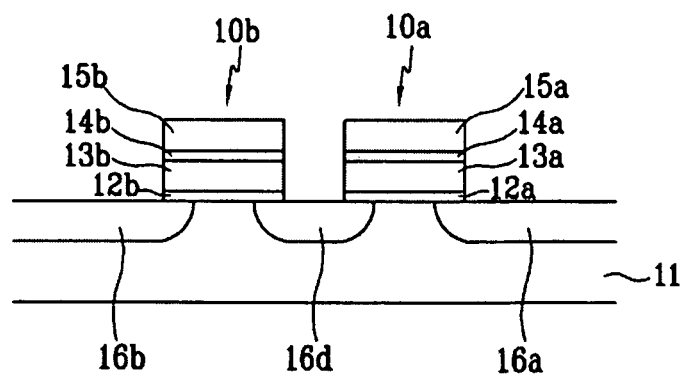
FIG. 1 to FIG. 4 are cross-sectional views illustrating example fabrication steps for an example nonvolatile semiconductor memory device constructed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Example nonvolatile semiconductor memory device and example methods of fabricating the same will now be described with reference to the accompanying drawings.

Figure 2:
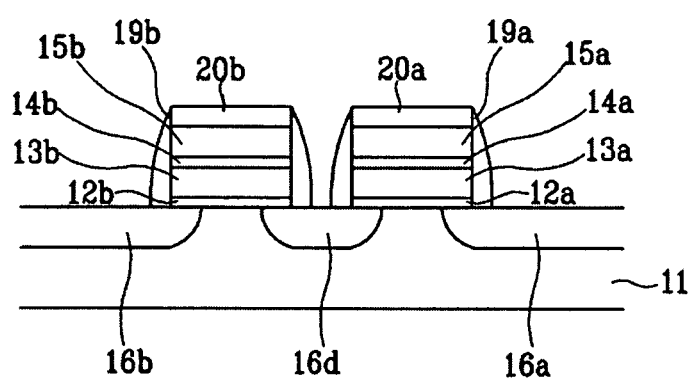
Figure 3:
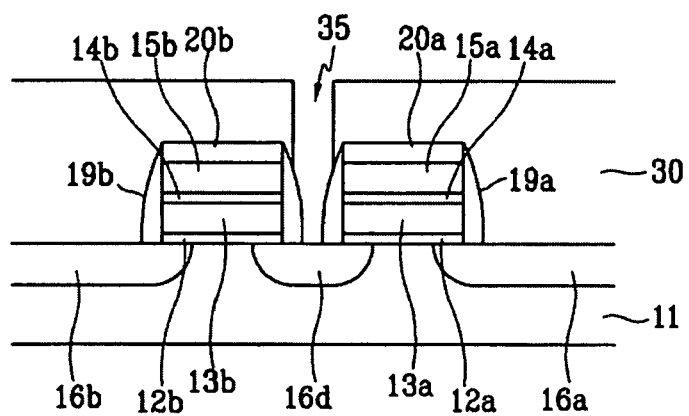
Figure 4:
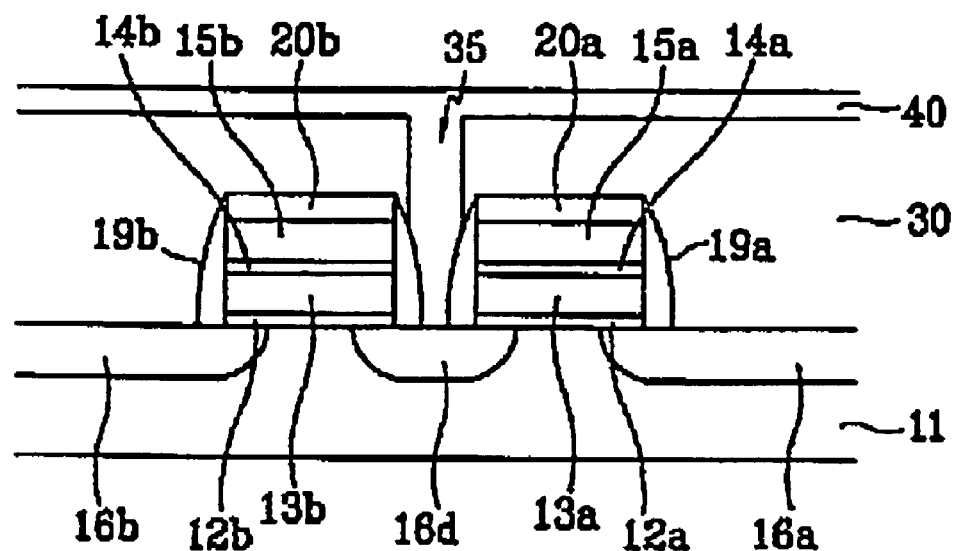

FIG. 1 to FIG. 4 are cross-sectional views illustrating example fabrication steps for an example nonvolatile semiconductor memory device constructed in accordance with the teachings of the present invention. In the example of FIG. 4, the nonvolatile semiconductor memory device includes a semiconductor substrate 11, and first and second cells 10a and 10b formed on the semiconductor substrate 11 at a predetermined distance from each other.

The first semiconductor cell 10a includes a first gate dielectric layer 12a, a first floating gate 13a, a first inter poly layer 14a, and a first control gate 15a. The second semiconductor cell 10b includes a second gate dielectric layer 12b, a second floating gate 13b, a second inter poly layer 14b, and a second control gate 15b.

A first source contact 16a and a drain contact 16d are formed within the semiconductor substrate 11 outwardly at opposite sides of the first semiconductor cell 10a. A second source contact 16b and the drain contact 16d are arranged within the semiconductor substrate 11 outwardly at opposite sides of the second semiconductor cell 10b. The drain contact 16d is shared by the first semiconductor cell 10a and the second semiconductor cell 10b.

First and second dielectric layers 20a, 20b are respectively formed on the first control gate 15a and the second control gate 15b. The first and second dielectric layers 20a, 20b may be referred to as cap dielectric layers. First and second sidewall spacers 19a, 19b are respectively formed on the sidewalls of the first and second semiconductor cells 10a, 10b.

Next, an inter metal dielectric layer 30 is formed so as to cover the first and second cap dielectric layers 20a, 20b, the first and second sidewall spacers 19a, 19b, and the semiconductor substrate 11. A drain contact hole 35 is formed in the inter metal dielectric layer 30 to expose the drain contact 16d therethrough.

Next, a drain contact 40, which is made of tungsten or copper, is formed within the drain contact hole 35 formed in the inter metal dielectric layer 30. The drain contact 16d is electrically connected with the drain contact 40.

An example method for fabricating the above described nonvolatile semiconductor memory device will now be described. First, as shown in FIG. 1, the first semiconductor memory cell 10a and the second semiconductor memory cell 10b are formed on the semiconductor substrate 11 with a predetermined distance therebetween.

As mentioned above, the first semiconductor memory cell 10a includes a first gate dielectric 12a, a first floating gate 13a, a first inter poly layer 14a, and a first control gate 15a. The second semiconductor memory cell 10b includes a second gate dielectric layer 12b, a second floating gate 13b, a second inter poly layer 14b, and a second control gate 15b.

A first source contact 16a and a drain contact 16d are formed within the semiconductor substrate 11 on opposite sides of the first semiconductor cell 10a. A second source contact 16b is formed within the semiconductor substrate on a side of the second semiconductor cell 10b. The drain contact 16d is shared by the first semiconductor cell 10a and the second semiconductor cell 10b.

Next, as shown in FIG. 2, a first cap dielectric layer 20a and a second cap dielectric layer 20b are respectively formed on the first and second control gates 15a, 15b.

Subsequently, first sidewall spacers 19a and second sidewall spacers 19b are formed on the sidewalls of the respective first and second semiconductor cells 10a, 10b by patterning a nitride layer.

Next, as shown in FIG. 3, an inter metal dielectric layer 30 is formed on the first and second cap dielectrics 20a, 20b, the first and second sidewall spacers 19a, 19b, and the semiconductor substrate 11.

Subsequently, a drain contact hole 35 to expose the drain contact 16d is formed by patterning the inter metal dielectric layer 30. In this example, the first and second sidewall spacers 19a, 19b act as an etch protection layer during the etch process for forming the drain contact hole 35. As a result, even if the distance between the first and second semiconductor cells 10a, 10b is narrow, the drain contact hole 35 can be formed without damaging the first and second semiconductor cells 10a, 10b. Since the first and second semiconductor cells 10a, 10b can be formed with a narrow distance therebetween, it is possible to reduce the entire cell size in comparison with a conventionally forming drain contact hole 35'.

Figure 5:
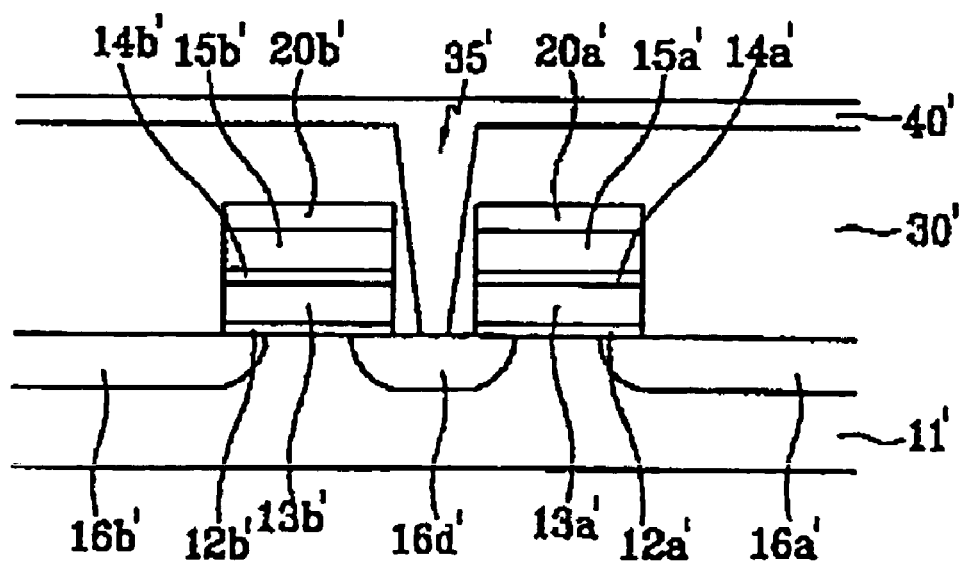
FIG. 5 is a cross sectional view illustrating a drain contact hole and a drain contact on an inter metal dielectric layer of a conventional nonvolatile semiconductor memory device.

FIG. 5 shows a conventional drain contact hole 35' filled with a drain contact in an inter metal dielectric layer 30' of a conventional nonvolatile semiconductor memory device. To facilitate comparison between the disclosed example memory device of FIGS. 1-4 and the conventional memory device of FIG. 5, like reference numbers denoted with a prime symbol (')are used to refer to similar structures.

As shown in FIG. 5, when forming the drain contact hole 35' between the first semiconductor cell 10a' and the second semiconductor cell 10b', the first semiconductor cell 10a' and/or the second semiconductor cell 10b' may be damaged due to the arrangement. In the conventional method, this problem has been solved by increasing the distance between the first and second semiconductor cells 10a', 10b', but this increases the cell size. In the example device of FIGS. 1-4, however, the distance between the first and second cells is decreased by forming the first and second cap dielectric layers 20a, 20b and the first and second sidewall spacers 19a, 19b, thereby resulting in a decrease of the cell size.

Returning to the example of FIG. 4, the drain contact 40 is formed inside the drain contact hole 35 and on the inter metal dielectric layer 30. The drain contact 40 may be made from tungsten or copper.

Figure 6:
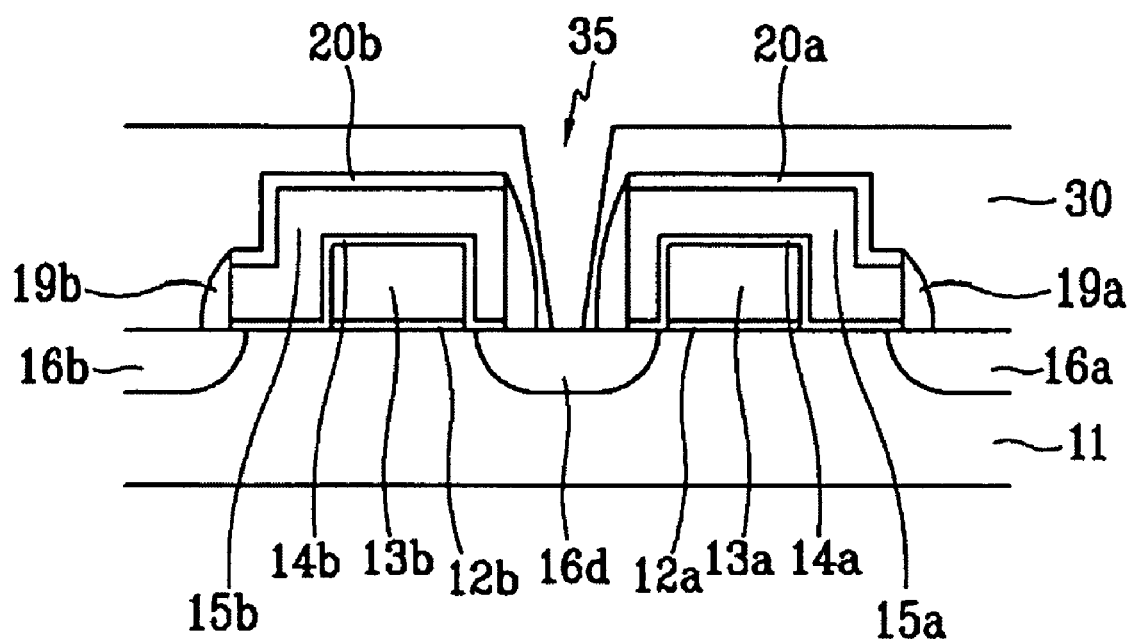
FIG. 6 is a cross sectional view illustrating another example nonvolatile semiconductor memory device constructed in accordance with the teachings of the present invention.

FIG. 6 is a cross sectional view illustrating another example nonvolatile semiconductor memory device constructed in accordance with the teachings of the present invention. In the example of FIG. 6, the nonvolatile semiconductor memory device includes a drain contact hole 35 adapted to a split gate type cell structure.

In the example of FIG. 6, the first and second cap dielectric layers 20a, 20b and the first and second sidewall spacers 19a, 19b (acting as an etching protection layer) are formed such that the first and second semiconductor cell 10a, 10b can be formed so as to decrease the distance between the first semiconductor cell 10a and the second semiconductor cell 10b. This results in a decrease of the entire cell size.

As described above, since the drain contacts of the ETOX cell and the split gate type cell are formed after forming the first and second cap dielectric layers 20a, 20b and the first and second sidewall spacers 19a, 19b as the etch protection layer, it is possible to reduce the entire cell size.

From the foregoing, persons of ordinary skill in the art will appreciate that nonvolatile semiconductor memory devices which have a reduced cell size have been disclosed. The cell size of the disclosed memory devices are reduced by forming a drain contact 40 of the nonvolatile memory cell through a self align technique.

A disclosed example nonvolatile semiconductor memory cell includes a semiconductor substrate, first and second semiconductor cells formed on the semiconductor substrate and separated by a predetermined distance, a first source contact and a second source contact formed within the semiconductor substrate on opposite sides of the first and second semiconductor cells, a drain formed within the semiconductor substrate between the first and second semiconductor cells, first and second cap dielectrics respectively formed on the first and second semiconductor cells, first and second sidewall spacers respectively formed on the sidewalls of the first and second semiconductor cells, an inter metal dielectric layer covering the first and second cap dielectrics, the first and second sidewall spacers, and the semiconductor substrate, and defining a drain contact hole exposing the drain contact, and a drain contact connected to the drain through the drain contact hole.

Preferably, the first semiconductor cell includes a first gate dielectric formed on the semiconductor substrate, a first floating gate formed on the first gate dielectric layer, a first inter poly layer formed on the first floating gate, and a first control gate formed on the first inter poly layer.

Preferably, the second semiconductor cell includes a second gate dielectric formed on the semiconductor substrate, a second floating gate formed on the second gate dielectric, a second poly layer formed on the second floating gate, and a second control gate formed on the second poly layer.

Preferably, the first and second sidewall spacers are made from a nitride layer.

A disclosed example method for fabricating a nonvolatile semiconductor memory cell includes forming a first semiconductor cell and a second semiconductor cell on a semiconductor substrate and separated by a predetermined distance from one another, forming a first source contact and a second source contact within the semiconductor substrate outward of the first and second semiconductor cells, forming a drain within the semiconductor substrate between the first and second semiconductor cells, respectively forming first and second cap dielectric on the first and second semiconductor cells, respectively forming first and second sidewall spacers on the sidewalls of the first and second semiconductor cells, forming an inter metal dielectric layer covering the first and second cap dielectrics, the first and second sidewall spacers, and the semiconductor substrate, forming a drain contact hole in the inter metal dielectric layer to expose the drain, and forming a drain contact connecting to the drain through the drain contact hole.

It is noted that this patent claims priority from Korean Patent Application Serial Number 10-2003-0097919, which was filed on Dec. 26, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A nonvolatile memory cell comprising:
   a semiconductor substrate;
   first and second memory cells on the semiconductor substrate and separated by a distance;
   a first source and a second source in the semiconductor substrate adjacent the first and second memory cells;
   a drain in the semiconductor substrate between the first and second memory cells;
   first and second cap dielectrics on top surfaces of the first and second memory cells, respectively;
   first and second sidewall spacers on sidewalls of the first and second memory cells, respectively;
   a dielectric layer in direct physical contact with the first and second cap dielectrics and the first and second sidewall spacers on opposite sidewalls of the first and second memory cells, the dielectric layer defining a drain contact hole exposing the drain and the first and second sidewall spacers on one of the opposite sidewalls of each of the first and second memory cells; and
   a drain contact connected to the drain through the drain contact hole.

2. The nonvolatile memory device as defined in claim 1, wherein the first memory cell comprises:
   a first gate dielectric on the semiconductor substrate;
   a first floating gate on the first gate dielectric layer,
   a first inter poly layer on the first floating gate;
   a first control gate on the first inter poly layer.

3. The nonvolatile memory device as defined in claim 2, wherein the second memory cell comprises:
   a second gate dielectric on the semiconductor substrate;
   a second floating gate on the second gate dielectric;
   a second inter poly layer on the second floating gate; and
   a second control gate on the second inter poly layer.

4. The nonvolatile memory device as defined in claim 3, wherein the first and second floating gates and the first and second control gates comprise polysilicon.

5. The nonvolatile memory device as defined in claim 3, wherein the first sidewall spacer contacts the first gate dielectric layer, the first floating gate, the first inter poly layer, the first control gate, and the first cap dielectric, and the second sidewall spacer contacts the second gate dielectric layer, the second floating gate, the second inter poly layer, the second control gate, and the second cap dielectric.

6. The nonvolatile memory device as defined in claim 3, wherein the first and second sources are on opposite sides of the first and second control gates, respectively, from the drain.

7. The nonvolatile memory device as defined in claim 1, wherein the first and second sidewall spacers comprise a nitride.

8. The nonvolatile memory device as defined in claim 1, wherein the first source has a first pardon in an area of the substrate lateral to the first memory cell and a second portion in an area of the substrate underneath the first memory cell.

9. The nonvolatile memory device as defined in claim 8, wherein the second source has a first portion in an area of the substrate lateral to the second memory cell, and a second portion in an area of the substrate underneath the second memory cell.

10. The nonvolatile memory device as defined in claim 1, wherein the drain has a first portion in an area of the substrate between the first and second memory cells, and second portions in areas of the substrate under the first and second memory cells.

11. The nonvolatile memory device as defined in claim 1, wherein the drain contact comprises tungsten or copper.

12. The nonvolatile memory device as defined in claim 1, wherein the drain is shared by the first and second memory cells.

13. A method for fabricating a nonvolatile memory cell, comprising:
    forming a first memory cell and a second memory cell on a semiconductor substrate, the first and second memory cells being separated by a distance;
    forming a first source and a second source adjacent the first and second memory cells;
    forming a drain between the first and second memory cells;
    forming first and second cap dielectrics on the first and second memory cells, respectively;
    forming first and second sidewall spacers on sidewalls of the first and second memory cells, respectively;
    forming a dielectric layer in direct physical contact with the first and second cap dielectrics and the first and second sidewall spacers on opposite sidewalls of the first and second memory cells;
    forming a drain contact hole in the dielectric layer exposing the drain and the first and second sidewall spacers on one of the opposite sidewalls of each of the first and second memory cells, without exposing either of the first and second cap dielectrics; and
    forming a drain contact connected to the drain in the drain contact hole.

14. The method as defined in claim 13, wherein forming the first and second sidewall spacers comprises forming and patterning a nitride layer.

15. The method as defined in claim 13, wherein forming the drain contact hole comprises etching the dielectric layer.

16. The method as defined in claim 13, wherein the first and second sidewall spacers protect the medial sidewalls of the first and second memory cells during etching.

17. The method as defined in claim 13, wherein forming the drain contact comprises depositing tungsten or copper.

18. The method as defined in claim 13, wherein the drain is shared by the first and second memory cells.

19. The method as defined in claim 13, wherein each of the first and second memory cells comprises:
    a gate dielectric on the semiconductor substrate;
    a floating gate on the gate dielectric layer;
    an inter poly layer on first floating gate;
    a control gate on the inter poly layer.

20. The method as defined in claim 19, wherein the first and second sources are on opposite sides of the control gates of the first and second memory cells, respectively, from the drain.

* * * * *